United States Patent
Weder et al.

(10) Patent No.: US 6,590,821 B2
(45) Date of Patent: Jul. 8, 2003

(54) MEMORY DEVICE

(75) Inventors: Uwe Weder, Au (DE); Hans-Heinrich Viehmann, South Burlington, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/127,670

(22) Filed: Apr. 22, 2002

(65) Prior Publication Data

US 2002/0152365 A1 Oct. 17, 2002

Related U.S. Application Data

(63) Continuation of application No. PCT/DE00/03682, filed on Oct. 19, 2000.

(30) Foreign Application Priority Data

Oct. 20, 1999 (EP) .............................. 99120074

(51) Int. Cl.[7] ................................. G11C 7/00
(52) U.S. Cl. ..................... 365/207; 365/202; 365/205; 365/196
(58) Field of Search ................. 365/202, 205, 365/206, 196

(56) References Cited

U.S. PATENT DOCUMENTS

| 5,258,669 | A | | 11/1993 | Nakashima | |
|---|---|---|---|---|---|
| 5,834,953 | A | | 11/1998 | Glass et al. | |
| 6,449,194 | B1 | * | 9/2002 | Akiyoshi | 365/189.02 |
| 2002/0126540 | A1 | * | 9/2002 | Akiyoshi | 365/189.02 |
| 2002/0152365 | A1 | * | 10/2002 | Weder et al. | 711/200 |

FOREIGN PATENT DOCUMENTS

EP 0 390 404 A2 10/1990

* cited by examiner

*Primary Examiner*—Viet Q. Nguyen
(74) *Attorney, Agent, or Firm*—Laurence A. Greenberg; Werner H. Stemer; Ralph E. Locher

(57) ABSTRACT

A description is given of a memory device having memory cells for storing data. The memory device described is distinguished by the fact that a current switch-off device is provided, which prevents an existing current flow through the memory cell to be read in response to the identification of the memory cell content, and/or that a discharge device is provided, which partly discharges again a node in the memory cell which is to be precharged before the memory cell is read.

6 Claims, 1 Drawing Sheet

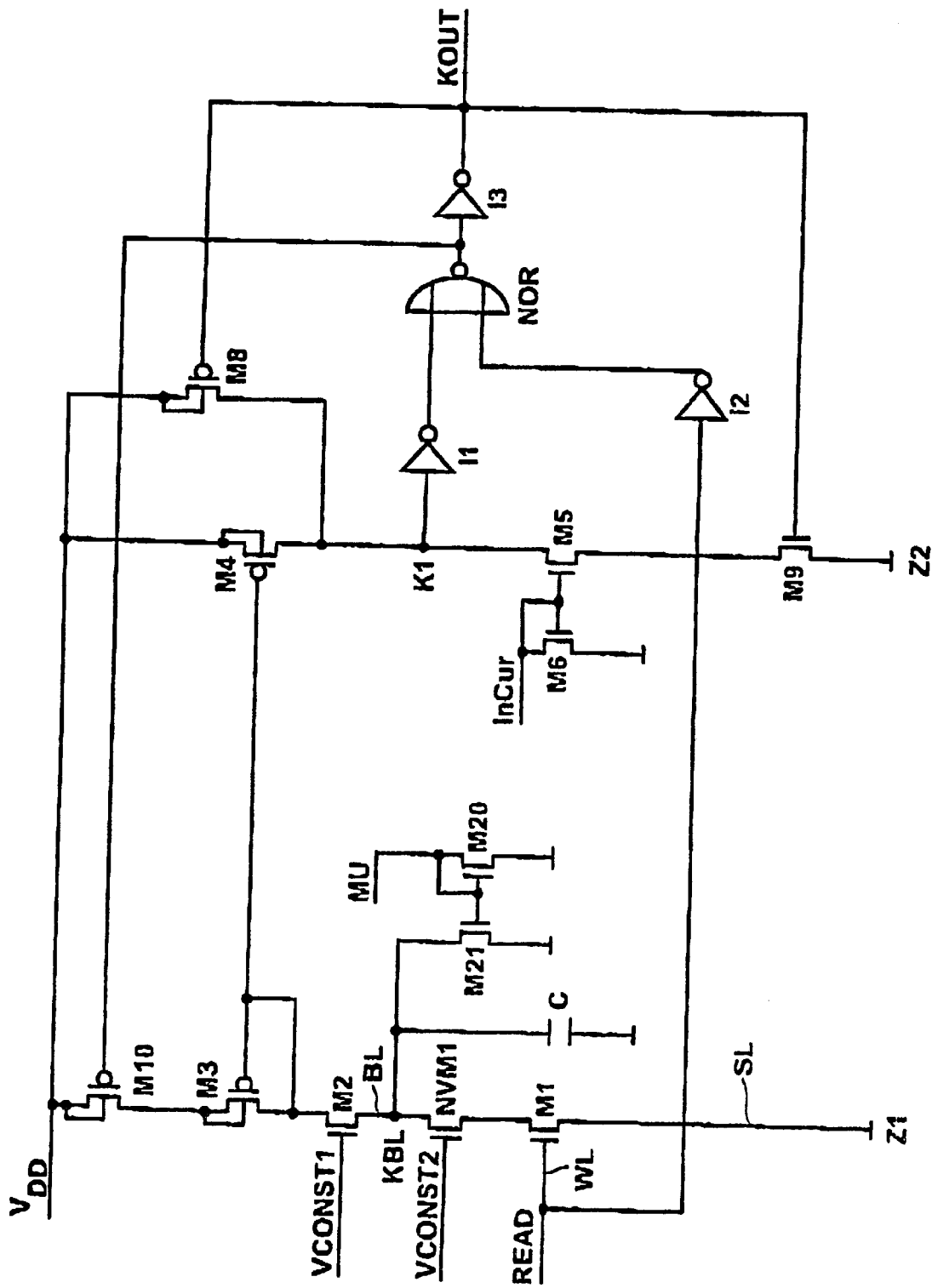

MEMORY DEVICE

CROSS-REFERENCE TO RELATED APPLICATION

This application is a continuation of copending International Application No. PCT/DE00/03682, filed Oct. 19, 2000, which designated the United States.

BACKGROUND OF THE INVENTION

Field of the Invention

The present invention relates to a memory device having memory cells for storing data, a sense amplifier, by which the content of the relevant memory cell can be determined on the basis of the magnitude and/or the direction of a current flow established through a memory cell during the read-out thereof.

Memory devices of this type have been known for many years in innumerable embodiments.

In the development of memory devices, as also in the case of other electrical circuits, great efforts are made in an attempt to keep the energy consumption as low as possible, or to reduce it further. In this context, considerable success has already been achieved particularly in recent years. However, the energy consumption of memory devices is still too high for certain applications.

One of these applications is memory devices for use in contactless smart cards.

As is known, contactless smart cards are connected to other devices exclusively in a wire-free manner. Even the energy required for their operation is transmitted in a wire-free manner; it is extracted from electromagnetic oscillations received by the smart card and is buffer-stored in a capacitor. However, the energy that can be buffer-stored in smart cards is extremely low in particular owing to the highly restricted storage possibilities. Accordingly, components contained in wire-free smart cards must be able to be operated with a minimum of energy. Conventional memory devices do not yet satisfy this requirement.

Published, European Patent Application EP 0 390 404 A shows a memory device having nonvolatile memory cells, and also a sense amplifier and the driving thereof. The sense amplifier contains a sense amplifier having feedback inverters. A current branch that is driven by the bit line connected to the memory cell is connected in parallel with an input-side transistor of the sense amplifier. The output of the sense amplifier is fed back to an NMOS transistor in order to decouple the bit line from the sense amplifier. The NMOS transistor is connected in series with a PMOS transistor and is located on the side of the memory cell.

U.S. Pat. No. 5,258,669 shows a memory cell and also a read-out circuit in which the bit line capacitance is precharged from a current path connected to the supply voltage.

SUMMARY OF THE INVENTION

It is accordingly an object of the invention to provide a memory device which overcomes the above-mentioned disadvantages of the prior art devices of this general type, which operates as intended with a minimum of energy.

With the foregoing and other objects in view there is provided, in accordance with the invention, a memory device. The memory device contains a terminal for supplying a pole of a supply voltage, a memory cell for storing data in a memory transistor, and a sense amplifier for ascertaining a content of the memory cell on a basis of a magnitude and/or a direction of a current flow established through the memory cell during a read-out of the memory cell. The sense amplifier has an output and complementary transistors coupled in series with each other, and the output of the sense amplifier is fed back to the complementary transistors. A current mirror has a mirror transistor coupled in series with the memory transistor and a current branch connected in parallel with one of the complementary transistors of the sense amplifier. The mirror transistor has a remote terminal remote from the memory cell. A current switch-off device is provided for interrupting the current flow through the memory cell to be read while the memory cell content is ascertained. The current switch-off device has a transistor connected between the remote terminal of the mirror transistor and the terminal for supplying the pole of the supply voltage.

The invention has the positive effect that the time during which electric currents flow in the memory device and the sense amplifier can be reduced to a minimum.

The invention further has the positive effect that this considerably shortens the time required for reading from the memory cells; as a result, the memory device and/or a system containing it has to be activated for a shorter time than has previously been the case.

The energy consumption of the memory device decreases in both cases; such memory devices can be operated as intended with a minimum of energy.

In accordance with an added feature of the invention, the mirror transistor is a PMOS transistor, the current branch has a PMOS transistor, the complementary transistor of the sense amplifier which is connected in parallel with the current branch is a PMOS transistor, and the transistor contained in the current switch-off device is a PMOS transistor.

In accordance with another feature of the invention, the mirror transistor, the PMOS transistor contained in the current branch of the current mirror circuit, and the complementary transistor of the sense amplifier which is connected in parallel with the current branch are directly connected to the terminal for the pole of the supply voltage.

In accordance with an additional feature of the invention, the sense amplifier has an inverter with an input and a feedback output forming the output of the sense amplifier. The transistor contained in the current switch-off device has a control input connected to the input of the inverter.

In accordance with a further feature of the invention, the sense amplifier outputs a signal which signals the content of the memory cell to be read. The signal is held in a previous state after the current flow through the memory cell to be read has been prevented by the current switch-off device.

In accordance with a further added feature of the invention, the process of preventing the current flow through the memory cell to be read, which is performed by the current switch-off device, is ended with an ending of a read-out operation of the memory cell.

With the foregoing and other objects in view there is provided, in accordance with the invention, a memory device. The memory device contains a memory cell for storing data and sense amplifier for ascertaining a content of the memory cell on a basis of a magnitude and/or a direction of a current flow established through the memory cell during a read-out of the memory cell. The sense amplifier is coupled to the memory cell. A node is connected to the memory cell, the node being precharged before the memory cell is read, and a discharge device is connected to the node for partly discharging again the node.

In accordance with an added feature of the invention, a bit line is provided, and the node is part of the bit line assigned to the memory cell to be read.

In accordance with an additional feature of the invention, the memory cell has a memory transistor with a terminal connected to the node.

In accordance with a further feature of the invention, the discharge device discharges the node to a potential that is established there when a current that is to be detected by the sense amplifier flows through the memory cell.

In accordance with another feature of the invention, the node is discharged before a beginning of the read-out of the memory cell by the sense amplifier.

In accordance with a concomitant feature of the invention, the node is discharged with an adjustable current.

Other features which are considered as characteristic for the invention are set forth in the appended claims.

Although the invention is illustrated and described herein as embodied in a memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a circuit diagram of a detail of a memory device according to the invention.

DESCRIPTION OF THE PREFERRED EMBODIMENTS

Referring now to the single FIGURE of the drawing in detail, there is shown a memory device embodied as an EEPROM. However, there is no restriction thereto. The special features of the EEPROM which are described below can also be used beneficially in any other nonvolatile or volatile (semiconductor) memory devices such as, for example flash memories, RAMS, etc.

For the sake of clarity, the FIGURE illustrates only a single memory cell of the many memory cells that an EEPROM usually has.

The memory cell shown contains a memory transistor designated by the reference symbol NVM1 and a selection transistor designated by the reference symbol M1, which is connected in series with the memory transistor. The selection transistor M1 is connected to ground via a so-called source line SL, and the memory transistor NVM1 is connected to a supply voltage potential $V_{DD}$ via a so-called bit line BL and transistors M2, M3 and M10.

The selection transistor M1 is driven by a read signal READ via a so-called word line WL. The transistors NVM1 and M2 are driven by signals VCONST1 (transistor M2) and VCONST2 (transistor NVM1). The aforementioned signals are constant—at least during the precharge and/or read-out described in more detail below—and, in the example considered, have values of 1.2 V (VCONST1) and 2 V (VCONST2).

The transistor M2 is a precharge transistor and serves for charging a node KBL located between it and the transistor NVM1 (the bit line BL running between it and the transistor NVM1) to a predetermined potential.

The transistor M3 serves for mirroring a current flowing via the bit line BL into a branch Z2, which will be described in more detail below.

The transistor M10 serves to interrupt, as required, the connection of the branch which contains it (the branch Z1 defined below) to the supply voltage potential $V_{DD}$ (to prevent a current flowing through the branch Z1).

The circuit section described above, i.e. the circuit branch containing the transistors M10, M3, M2, NVM1 and M1, forms the (first) branch Z1 already mentioned.

The second branch Z2, likewise already mentioned, is located in parallel with the first branch Z1. The second branch Z2 contains a series circuit of transistors M4, M5, and M9, the transistor M4 being connected to the supply voltage potential $V_{DD}$, and the transistor M9 being connected to ground.

The transistors M4 and M5 are driven in such a way that quite specific currents flow through each of them, to be precise a current corresponding to the current flowing through the first branch Z1 flows through the transistor M4 (the transistors M3 and M4 form a current mirror which causes a current corresponding to the current flowing through the transistor M3 to flow through the transistor M4), and a reference current InCur which is caused to flow through a transistor M6 flows through the transistor M5 (the transistors M5 and M6 form a current mirror which causes a current corresponding to the current flowing through the transistor M6 to flow through the transistor M5).

The transistor M9 serves "only" to interrupt the second branch Z2 as required (to prevent a current flowing through the second branch Z2).

The currents flowing through the transistors M4 and M5 meet one another at a node K1 located between the transistors M4 and M5. A potential that is dependent on the relative magnitude of the currents is established at the node K1. The level of the potential represents the content of the memory cell to be read, but is not yet the output signal of the configuration representing the content of the memory cell.

The potential of the node K1 is inverted by a first inverter I1. An output signal of the first inverter I1 is fed to a NOR element NOR, where it is NORed with the already mentioned READ signal, which is inverted by a second inverter I2. The output signal of the NOR element NOR is used for driving the transistor M10 and is furthermore fed to a third inverter I3. The output signal of the third inverter I3 is used as an output signal KOUT of the configuration shown.

In the example considered, KOUT has the value 0, if the signal READ has the level 1, that is to say the memory cell is read, and the transistor NVM1 is programmed in such a way that it has a low threshold voltage, that is to say turns on during the read-out operation. KOUT has the value 1, if the signal READ has the level 1, that is to say the memory cell is read, and the transistor NVM1 is programmed in such a way that it has a high threshold voltage, that is to say turns off during the read-out operation, or if and as long as the signal READ has the level 0, that is to say the memory cell is not read.

The signal KOUT is also used to drive the transistor M9 located in the second branch and a transistor M8 disposed in parallel with the transistor M4.

The memory cell is read in two stages, namely a precharge stage and a subsequent detection stage.

The precharge stage is a preparation for the read operation that takes place (in the detection stage); the (read) signal READ still has the level 0 in the precharge stage. The aim of the precharge stage is to precharge the node KBL to a specific potential. In the precharge stage, the transistors M10, M3, M2, NVM1 and M1 contained in the first branch Z1 are driven in such a way that the transistors M10, M3 and M2 turn on, and that the transistor M1 turns off. As a result, and because the node KBL is connected to ground via a parasitic capacitance C, the node KBL is charged asymptotically to VCONST1 (first by a so-called strong inversion current and then by a so-called weak inversion current).

Since the transistor M1 turns off, no current, or at least no appreciable current, can flow via the first branch Z1 in the precharge stage.

As a result, the transistor M4 turns off, so that no current, or at least no appreciable current, flows in the second branch Z2 either.

On account of the level 0 of the signal READ, the output signal of the second inverter I2 has the level 1, the output signal of the NOR element NOR has the level 0, and the output signal of the third inverter I3 (and thus also the output signal KOUT of the arrangement) has the level 1.

Through the level 0 of the output signal of the NOR element NOR, the (PMOS) transistor M10 driven thereby is or remains turned on; through the level 1 of KOUT, the (NMOS) transistor M9 driven thereby is or remains turned on and the (PMOS) transistor M8 likewise driven thereby is or remains turned off.

The node K1 of the second branch Z2 can be pulled to ground potential via the transistor M9.

The precharge stage is followed by the already mentioned detection stage, in which the memory cell is actually read; the read signal READ now has the level 1. In the detection stage, the transistors contained in the first branch Z1 are driven in such a way that they turn on given the presence of suitable voltages at the source or drain terminals. The fact of whether actually all the transistors in the first branch Z1 turn on depends on the state of the transistor NVM1. If the transistor NVM1 is programmed in such a way that it has a high threshold voltage, then the transistor NVM1 turns off; if the transistor NVM1 is programmed in such a way that it has a low threshold voltage, then the transistor NVM1 and the other transistors provided in the first branch Z1 turn on. These operations are known and require no further explanation.

If the transistor NVM1 is programmed in such a way that it turns off in the detection stage, no current can flow via the first branch Z1.

As a result, the transistor M4 in the second branch maintains its state unchanged. In other words, like in the precharge stage, it remains turned off, so that now, too, no current can flow through the second branch Z2.

The potential of the node K1 in the second branch Z2 also remains unchanged. In other words, like in the precharge stage, the node K1 remains at ground potential.

Thus, the output signal of the first inverter I1 remains at the level 1, the output signal of the NOR element NOR remains at the level 0, and the output signal of the third inverter I3 (the output signal KOUT of the entire configuration) remains at the level 1, which in turn has the consequence that the transistors M9 and M10 remain turned on and the transistor M8 remains turned off.

If the transistor NVM1 is programmed in such a way that it turns on in the detection stage, a current can flow via the first branch Z1. In the example considered, the transistors (in particular the transistor NVM1) provided in the first branch Z1 are dimensioned and driven in such a way that the current flowing via the first branch Z1 is 11 $\mu$A.

By the transistors M3 and M4 acting as a current mirror, the current is also caused to flow in that part of the second branch Z2 that lies above the node K1. The reference current InCur already mentioned flows in that part of the second branch Z2 that lies below the node K1. The flowing of the current in the second branch Z2 is based on current mirroring by the transistors M6 and M5 acting as a current mirror. The reference current InCur is caused to flow to ground through the transistor M6 and from there is mirrored into the second branch Z2 using the transistors M6 and M5. The (reference) current flowing in that part of the second branch Z2 which lies below the node K1 is in the opposite direction to the current flowing in that part of the second branch Z2 which lies above the node K1. However, the (reference) current flowing in that part of the second branch Z2 which lies below the node K1 is in this case significantly smaller than the current flowing in that part of the second branch Z2 which lies above the node K1; it is only half as large, that is to say has a value of only 5.5 $\mu$A, in the example considered.

Since the current flowing in that part of the second branch Z2 which lies above the node K1 is greater than the current flowing in that part of the second branch Z2 which lies below the node K1, the node K1 is pulled toward the supply voltage potential $V_{DD}$.

Thus, the output signal of the first inverter I1 goes to the level 0, the output signal of the NOR element NOR to the level 1 (the output signal of the second inverter I2 likewise has the level 0 owing to READ=1), and the output signal of the third inverter I3 (the output signal KOUT of the entire configuration) to the level 0.

Through the level 1 of the output signal of the NOR element NOR, the transistor M10 driven thereby is put into a non-conducting state, as a result of which the current flow in the first branch Z1 is interrupted.

At the same time, through the level 0 of the output signal KOUT, the transistor M8 disposed in parallel with the transistor M4, which is now turned off, is put into the on state, as a result of which the node K1 is held at high potential. At the same time, through the level 0 of the output signal KOUT, the transistor M9 is put into the off state, as a result of which current can no longer flow through the second branch Z2 either, and as a result of which the node K1 is pulled completely to $V_{DD}$.

The current flow to be detected by the configuration, i.e. the current flow ensuing via the transistor NVM1 and the bit line BL, and current flows required for detecting the current flow (in particular the current flow which ensues through the second branch Z2) are thus maintained only for as long as is required to detect the current to be detected. The above-mentioned current flows are prevented immediately after detection, more precisely in response to the detection of the current flow to be detected.

Normally, i.e. without the above-described prevention of the current flows, the latter would last until the detection stage representing the actual read operation is ended by a change in the READ signal from the level 1 to the level 0. By virtue of the fact that the current flows are already prevented within the detection stage, the relevant currents flow for a considerably shorter time than has previously been the case. As a result, the power consumption and the energy consumption of memory devices can be considerably reduced.

A positive effect is had on the power consumption and the energy consumption of memory devices if, in addition or as an alternative, care is taken to ensure that the node KBL is precharged only approximately to the potential required to turn on the transistor NVM1 which is programmed for a low threshold voltage.

In the example considered, this is achieved by virtue of the fact that the node KBL is discharged via a transistor M21 with a very small current (in the nA range). In the example considered, a current (signal MU) sent through a transistor M20 can be used to define whether such a discharge process is carried out and when such a discharge process is to begin and end. The transistors M20 and M21 are connected up to form a current mirror, the current flowing through the transistor 20 being mirrored into the transistor M21. Given suitable dimensioning and driving of the transistors M20 and M21, what can be achieved is that the node KBL is discharged to a greater or lesser extent precisely until a predetermined desired potential is established at the node KBL. The desired potential is preferably approximately the potential established on the bit line when all the transistors in the first branch Z1 turn on (the current to be detected flows through the first branch Z1).

A process of discharging the node KBL which is effected in the manner described or differently takes account of the circumstance that in practice it is not possible, or at any rate not readily possible, to limit the precharging of the node in such a way that the abovementioned desired potential is established there.

This can be illustrated using the example of the (precharge) transistor M2. In order to ensure intended functioning of the transistor in the detection stage, the following must hold true for the voltage VCONST1 applied to the gate terminal of the transistor M2:

$$VCONST1 = V_{th} + V_{KBLdesired}$$

where $V_{th}$ is the threshold voltage of the transistor M2, and where $V_{KBLdesired}$ is the abovementioned desired potential to which the node KBL must be brought in order that a transistor NVM1 which is programmed for a low threshold voltage, but not a transistor NVM1 which is programmed for a high threshold voltage, is reliably turned on and kept turned on.

In the example considered, $V_{KBLdesired}$ has a value of approximately 0.6 V. This potential suffices to turn on and keep turned on a transistor NVM1 that is programmed for a low threshold voltage.

As has already been mentioned above, however, the node KBL is charged to VCONST1, that is to say to approximately 1.2 V, in the precharge stage. Therefore, after the beginning of the detection stage (after the change in the READ signal from the level 0 to the level 1) it takes a relatively long time until the current to be detected is established in the branch Z1. This is because if and for as long as the potential at the node KBL is greater than VCONST1-$V_{th}$, the transistor M2 turns off and thus prevents the flowing of the current to be detected. In this case, it takes a relatively long time until the node KBL is discharged from VCONST1 to VCONST1-$V_{th}$, because in this stage only a static current which gradually reverses the charge of the bit line capacitance C flows through the transistor NVM1.

If a process of discharging the node KBL that is effected in the manner described brings the potential established there in the precharge stage to approximately VCONST1-$V_{th}$, then the current to be detected is established immediately at the beginning of the detection stage (directly after the change in the READ signal from the level 0 to the level 1).

The potential established at the node KBL need not necessarily be brought to approximately VCONST1-$V_{th}$ through the discharge process. It already proves to be advantageous if it is not all that much greater than VCONST1-$V_{th}$. As a result, the time between the beginning of the precharge stage and the beginning of the current flow to be detected can be reduced to a greater or lesser extent.

An early occurrence of the current to be detected within the detection stages makes it possible to shorten the detection time and thus also the length of the detection stages. This proves to be an enormous advantage because considerably shorter memory access times can thereby be obtained in an amazingly simple manner. Shorter memory access times enable the realization of memory devices which operate faster and can be utilized under certain circumstances (for example in the case of use in wire-free smart cards) to the effect that the memory device or the system containing the memory device is activated for a shorter time or is put into an energy-saving standby operating mode earlier.

The memory device described can thus be operated with a minimum of energy.

We claim:

1. A memory device, comprising:
   a terminal for supplying a pole of a supply voltage;
   a memory cell for storing data and having a memory transistor;
   a sense amplifier for ascertaining a content of said memory cell on a basis of at least one of a magnitude and a direction of a current flow established through said memory cell during a read-out of said memory cell, said sense amplifier having an output and complementary transistors coupled in series with each other, and said output of said sense amplifier is fed back to said complementary transistors;
   a current mirror having a mirror transistor coupled in series with said memory transistor and a current branch connected in parallel with one of said complementary transistors of said sense amplifier, said mirror transistor having a remote terminal remote from said memory cell; and
   a current switch-off device for interrupting the current flow through said memory cell to be read while said memory cell content is being ascertained, said current switch-off device having a transistor connected between said remote terminal of said mirror transistor and said terminal for supplying the pole of the supply voltage.

2. The memory device according to claim 1, wherein:
   said mirror transistor is a PMOS transistor;
   said current branch has a PMOS transistor;
   said one of said complementary transistors of said sense amplifier which is connected in parallel with said current branch is a PMOS transistor; and
   said transistor contained in said current switch-off device is a PMOS transistor.

3. The memory device according to claim 2, wherein said mirror transistor, said PMOS transistor contained in said current branch of said current mirror circuit, and said one of said complementary transistors of said sense amplifier which is connected in parallel with said current branch are directly connected to said terminal for the pole of the supply voltage.

4. The memory device according to claim 1, wherein sense amplifier has an inverter with an input and a feedback output forming said output of said sense amplifier, said transistor contained in said current switch-off device has a control input connected to said input of said inverter.

5. The memory device according to claim 1, wherein said sense amplifier outputs a signal which signals the content of said memory cell to be read, the signal being held in a previous state after the current flow through said memory cell to be read has been prevented by said current switch-off device.

6. The memory device according to claim 5, wherein a process of preventing the current flow through said memory cell to be read, which is performed by said current switch-off device, is ended with an ending of a read-out operation of said memory cell.

* * * * *